(12) United States Patent
Zhang et al.

(10) Patent No.: US 9,553,232 B2
(45) Date of Patent: Jan. 24, 2017

(54) LIGHT EMITTER WITH A CONDUCTIVE TRANSPARENT P-TYPE LAYER STRUCTURE

(71) Applicant: BOLB INC., San Jose, CA (US)

(72) Inventors: Jianping Zhang, San Jose, CA (US); Hongmei Wang, San Jose, CA (US)

(73) Assignee: BOLB INC., San Jose, CA (US)

( * ) Notice: Subject to any disclaimer, the term of this patent is extended or adjusted under 35 U.S.C. 154(b) by 0 days.

(21) Appl. No.: 15/040,876

(22) Filed: Feb. 10, 2016

(65) Prior Publication Data

US 2016/0308091 A1    Oct. 20, 2016

Related U.S. Application Data

(62) Division of application No. 14/687,886, filed on Apr. 15, 2015, now Pat. No. 9,293,648.

(51) Int. Cl.
| | |
|---|---|
| *H01L 33/06* | (2010.01) |
| *H01L 33/00* | (2010.01) |
| *H01L 33/04* | (2010.01) |
| *H01L 33/32* | (2010.01) |
| *H01L 33/14* | (2010.01) |

(52) U.S. Cl.
CPC ........... *H01L 33/06* (2013.01); *H01L 33/0025* (2013.01); *H01L 33/0075* (2013.01); *H01L 33/04* (2013.01); *H01L 33/14* (2013.01); *H01L 33/32* (2013.01)

(58) Field of Classification Search
CPC ...... H01L 33/06; H01L 33/0025; H01L 33/22; H01L 33/14; H01L 33/32; H01L 33/0075; H01L 33/36; H01L 33/002; H01L 33/28

USPC ............................................... 438/47; 257/13
See application file for complete search history.

(56) References Cited

U.S. PATENT DOCUMENTS

| | | |
|---|---|---|
| 5,831,277 A | 11/1998 | Razeghi |
| 6,104,039 A | 8/2000 | Asatsuma et al. |
| 8,426,225 B2 | 4/2013 | Shatalov et al. |
| 2013/0193408 A1* | 8/2013 | Hwang ............... H01L 33/04 257/13 |
| 2014/0203287 A1* | 7/2014 | Zhang ............... H01L 33/145 257/76 |

OTHER PUBLICATIONS

J. P. Zhang et al., "Milliwatt power deep ultraviolet light-emitting diodes over sapphire with emission at 278 nm" Applied Physics Letters, vol. 81, No. 26, Dec. 23, 2002, pp. 4910-4912.

* cited by examiner

*Primary Examiner* — Walter H Swanson
(74) *Attorney, Agent, or Firm* — J.C. Patents

(57) ABSTRACT

A light emitting device includes an n-type layer, a p-type layer structure, a layer of p-type nano-dots imbedded in the p-type layer structure, and an active region sandwiched between the n-type layer and the p-type layer structure, where the p-type nano-dots possess a sheet density of $10^{10}$ to $10^{12}$ cm$^{-2}$, a lateral dimension of 2-20 nm, and a vertical dimension of 1-5 nm. The p-type layer structure with a layer of p-type nano-dots imbedded therein provides good vertical conductivity and UV transparency. Also provided is a method for making the light emitting device.

12 Claims, 5 Drawing Sheets

LIGHT EMITTER WITH A CONDUCTIVE TRANSPARENT P-TYPE LAYER STRUCTURE

CROSS-REFERENCE TO RELATED APPLICATION

This application is a divisional application of, and claims the priority benefit of, U.S. application Ser. No. 14/687,886 filed on Apr. 15, 2015.

1. FIELD OF THE INVENTION

The present invention relates in general to semiconductor light emitters with a conductive transparent p-type layer structure, more particularly to group III nitride compound semiconductor ultraviolet light emitters with a conductive transparent p-type AlGaN layer structure with a layer of p-type nano-dots imbedded therein, and method of forming the same.

2. DESCRIPTION OF THE RELATED ART

Nitride compound semiconductors such as InN, GaN, AlN, and their ternary and quaternary alloys are viewed as very important optoelectronic materials. Depending on alloy composition, nitride compounds can enable ultraviolet (UV) emissions ranging from 410 nm down to approximately 200 nm. This includes UVA (400-315 nm), UVB (315-280 nm), and part of UVC (280-200 nm) regimes. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity & dosage, which is ideal treatment for fresh food, water and surface storage, disinfection, and sterilization. Further, the light output can be modulated at frequencies up to a few hundreds of mega-hertz, promising them innovative light sources for covert communication and bio-chemical detection.

At the present, commercially available UVB and UVC light-emitting diodes (LEDs) commonly adopt the laminate structure containing a c-plane sapphire as UV transparent substrate, an AlN layer coated over the substrate serving as epitaxy template, and a set of AlN/AlGaN superlattice for dislocation and strain management. The utilization of AlN template and AlN/AlGaN superlattice enables the growth of high-quality high-conductivity n-type AlGaN electron supplier layer, which injects electrons into the following AlGaN-based multiple quantum well (MQW) active-region. On the other side of the MQW active-region are an AlGaN electron-blocking layer, an AlGaN hole injection layer, a hole supplier layer and a p-type GaN or InGaN layer for ohmic contact formation. The prior art AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

Since acceptor ionization energy increases linearly with Al-composition in AlGaN material, and hole concentration decreases exponentially with acceptor ionization energy, acceptor-doped AlGaN material (p-type AlGaN or p-AlGaN) possesses exponentially increasing electrical resistivity with Al-composition. This means conventional p-type AlGaN layers which are UV transparent usually are highly resistive, unsuitable for serving as a hole supplier layer and p-type ohmic contact layer. Hence in the prior art UV LEDs p-type GaN or InGaN layer is commonly used as hole supplier layer and ohmic contact layer. P-type GaN and InGaN layers are UV opaque and the application of them in UV LEDs severely limits the LED light extraction efficiency. The prior art UV LEDs emitting in the UVB and UVC regimes practically only have a light extraction efficiency as small as 6%-10%.

Superlattice structures containing p-type AlGaN barrier layers and p-type GaN well layers have been proposed to replace conventional p-type AlGaN layer for improved conductivity and preserved UV transparency (e.g. U.S. Pat. Nos. 5,831,277, 6,104,039, and 8,426,225, the contents of which are incorporated herein by reference in their entirety). The valence band and polarization discontinuities between AlGaN and GaN will lead to hole accumulation within the GaN wells. Holes can move freely within the GaN well planes, however, the AlGaN/GaN valence band and polarization discontinuities will impede hole movement in the directions perpendicular to the GaN well plane. This is to say, that the p-type AlGaN/GaN superlattice can have improved lateral conductivity yet with limited vertical conductivity, not suitable for vertical hole injection into the MQW active-region for light emissions. To enhance the vertical conductivity of the p-AlGaN/GaN superlattice, the thickness of the p-AlGaN barrier layer within the superlattice can be estimated according to hole's Bohr radius as the rule of thumb:

$$a_B = \frac{4\pi\varepsilon_r\varepsilon_0 h^2}{m_k e^2} = \frac{m_0}{m_h}\varepsilon_r a_{B0} = 0.529\frac{m_0}{m_h}\varepsilon_r (\text{Å})$$

since the hole's effective mass $m_h$ in AlGaN is very heavy, close to that of the free electron mass, $m_0$, and the relative permittivity $\varepsilon_r$ of AlGaN material is in-between of 8 to 9 depending on Al-composition, hole's Bohr radius within AlGaN is approximately around 5 Å. When applying such a thin AlGaN layer in the AlGaN/GaN superlattice, a) if the GaN well layer is thick enough to maintain a good AlGaN/GaN interface, the superlattice will be UV opaque; b) if the GaN well layer also maintains the ultrathin thickness for UV transparency, the ultrathin AlGaN/GaN superlattice interface will be vanishing because of interface roughness and composition mixing, which turns the ultrathin period AlGaN/GaN superlattice identically to a conventional AlGaN alloy, losing all the hole accumulation benefit.

The present invention discloses p-type AlGaN structures with improved vertical hole conductivity yet maintaining UV transparency, and UV LEDs with such p-AlGaN structures with improved light extraction efficiency.

3. SUMMARY OF THE INVENTION

One aspect of the present invention relates to a light emitting device, which includes an n-type layer, a p-type layer structure, a layer of p-type nano-dots imbedded in the p-type layer structure, and an active region sandwiched between the n-type layer and the p-type layer structure.

The p-type nano-dots may have a sheet density of $10^{10}$ to $10^{12}$ cm$^{-2}$, a lateral dimension of 2-20 nm, and a vertical dimension of 1-5 nm.

The p-type layer structure may include a smooth p-type layer in direct contact with the active region, a rough p-type layer formed on the smooth p-type layer and having protrusions and depressions formed between the protrusions, and a confining p-type layer, where the layer of p-type nano-dots is formed on the rough p-type layer with the p-type nano-dots being formed in the depressions of the rough p-type layer, the confining p-type layer is conformally formed on the layer of p-type nano-dots.

The p-type layer structure may include a plurality of layers of the p-type nano-dots and a plurality of the confining p-type layers alternately and conformally stacked with the layers of the p-type nano-dots. The p-type nano-dots in the plurality of layers of the p-type nano-dots can be substantially vertically aligned.

The smooth p-type layer, the rough p-type layer, and the confining p-type layer can be made of AlGaN, with Al-composition of the smooth p-type layer being equal to or higher than Al-composition of the rough p-type layer, and Al-composition of the confining p-type layer being substantially equal to the Al-composition of the rough p-type layer, and the Al-composition of the rough p-type layer can be higher than 40%.

The p-type nano-dots can be made of GaN or InGaN with In-composition less than 10%, or AlGaN with Al-composition less than 5%.

The smooth p-type layer may have a thickness in the range of 5-30 nm, the confining p-type layer may have a thickness in the range of 2-10 nm.

The rough p-type layer may have a base, the protrusions are formed on the base, the base may have a thickness in the range of 0-10 nm, and the protrusions may have a sheet density of $10^{10}$ to $10^{12}$ cm$^{-2}$, a lateral dimension of 10-100 nm, and a vertical dimension of 5-30 nm.

The layer of p-type nano-dots can be a discontinuous or continuous layer.

In another embodiment, the p-type layer structure includes a smooth p-type layer in direct contact with the active region, a first smooth confining p-type layer formed on the smooth p-type layer, and a second smooth confining p-type layer, where the layer of p-type nano-dots is formed on the first smooth confining p-type layer, and the second smooth confining p-type layer is formed on the layer of p-type nano-dots.

The smooth p-type layer, the first smooth confining p-type layer, and the second smooth confining p-type layer can be made of AlGaN, with Al-composition of the smooth p-type layer being 5% higher than Al-composition of the first smooth confining p-type layer, and Al-composition of the second smooth confining p-type layer being substantially equal to the Al-composition of the first smooth confining p-type layer, and wherein the Al-composition of the first smooth confining p-type layer is higher than 30%.

The layer of p-type nano-dots can be made of InGaN with In-composition in the range of 0-10%, or AlGaN with Al-composition in the range of 0-5%, inclusively, so that the compressive strain experienced by the layer of p-type nano-dots is larger than 0.7% during epitaxial growth on the first smooth confining p-type layer.

The p-type layer structure may include a plurality of layers of p-type nano-dots and a plurality of second smooth confining p-type layers alternately stacked with the layers of p-type nano-dots.

The layer of p-type nano-dots is a continuous layer including wetting layer portion laterally surrounding the p-type nano-dots, and a thickness of the wetting layer portion can be in the range of 0.6-1.0 nm.

In another embodiment, the p-type layer structure may include a smooth p-type layer in direct contact with the active region and a smooth confining p-type layer, the layer of p-type nano-dots is formed directly on the smooth p-type layer, and the smooth confining p-type layer is formed on the layer of p-type nano-dots.

The light emitting device may further include a contact pad formed directly on the p-layer structure.

The light emitting device may further include a p-type GaN or InGaN ohmic contact layer formed on the p-layer structure and with a thickness of less than 10 nm, such as 2-8 nm.

Another aspect of the present invention relates to a method of forming a vertically conductive UV transparent p-type layer structure, which includes:

forming a smooth p-type AlGaN layer over a substrate at a temperature between 1000-1050° C.;

forming a rough p-type AlGaN layer with surface protrusions of height 5 to 30 nm, lateral size 10 to 100 nm, and sheet density $10^{10}$ to $10^{12}$ cm$^{-2}$ on the smooth p-type AlGaN layer at a temperature 50-200° C. lower than that of the smooth p-type AlGaN layer;

forming a p-type GaN or InGaN layer on the rough p-type AlGaN layer such that nano-dots are formed within depressions between the protrusions of the rough p-type AlGaN layer, wherein the nano-dots possess a sheet density of $10^{10}$ to $10^{12}$ cm$^{-2}$, a lateral dimension of 2-20 nm, a vertical dimension of 1-5 nm; and conformally forming another p-type AlGaN layer on the p-type GaN or InGaN layer to cover the nano-dots.

The formation of the rough surface p-type AlGaN can be performed at temperatures in the range of 800-1000° C.

Another aspect of the present invention relates to a method of forming a vertically conductive UV transparent p-type structure, which includes:

forming a p-type AlGaN layer with Al-composition larger than 30% at a temperature of 1000-1050° C.;

forming a p-type GaN or InGaN material with nominal thickness of 1-5 nm at a temperature of 800-1000° C.

The step of forming the p-type AlGaN layer and the p-type GaN or InGaN material can be repeatedly alternatively performed 3-10 times.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

5. DETAILED DESCRIPTION OF EMBODIMENTS

Figure 1A:
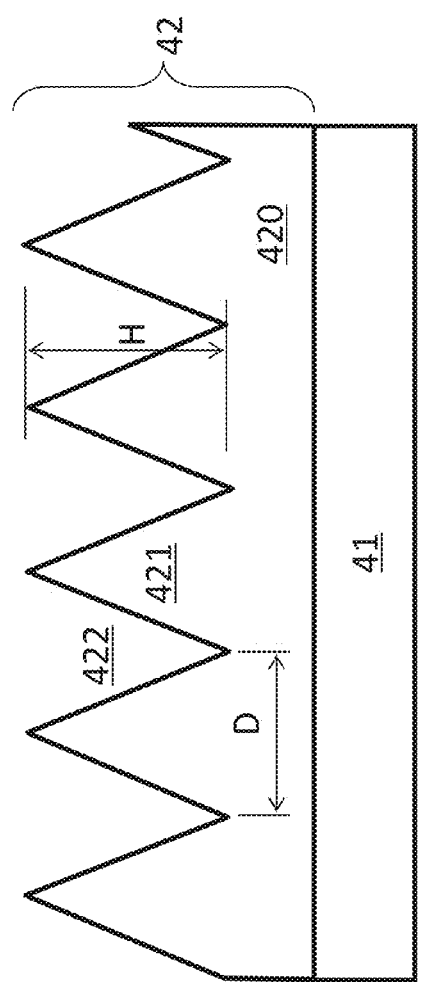
FIG. 1A illustrates the cross sectional schematic view of a partial p-type layer structure according to an embodiment of the present invention.

The present invention discloses a light emitting device with improved light extraction efficiency. Throughout the specification, the term III-nitride or nitride in general refers to metal nitride with cations selecting from group IIIA of the periodic table of the elements. That is to say, III-nitride includes MN, GaN, InN and their ternary (AlGaN, InGaN, InAlN) and quaternary (AlInGaN) alloys. In this specification, a quaternary can be reduced to a ternary for simplicity if one of the group III elements is significantly small. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$. A III-nitride layer or active-region means that the layer or active-region is made of III-nitride semiconductors.

In the following contents, wurtzite c-plane nitride light-emitting devices or structures are used as examples to elucidate the principle and spirit of the present invention. The teachings in this specification and given by the following embodiments can be applied to non-c-plane nitride semiconductors, II-VI semiconductors and other semiconductor devices.

According to embodiments of the present invention, a conductive UV-transparent p-type layer structure is used in a light emitting device, such as a UV LED. The conductive UV-transparent p-type layer structure can be used as an electron-blocking layer, a hole injection layer, a hole supplier layer, or an ohmic contact layer, or function as a combination of two or more of these layers because of its excellent vertical conductivity and UV-transparency. The p-type layer structure includes one or more layers of p-type nano-dots imbedded in the p-type layer structure. For example, the p-type layer structure may include two p-type layers such as two p-type AlGaN layers with one layer of p-type nano-dots sandwiched therebetween, or include two or more p-type layers and two or more layers of p-type nano-dots with each layer of p-type nano-dots sandwiched between two of the p-type layers. The p-type layers can be the same or different. For example, when using p-type AlGaN layers, the Al-composition of these p-type AlGaN layers can be the same or different. In one embodiment, the Al-composition of the p-type AlGaN layer in direct contact with the active region is 5-10% higher than that of the rest p-type AlGaN layers so as to provide good electron blocking effect. The layer of p-type nano-dots can be formed via epitaxial growth on a rough surface of a p-type layer, or via epitaxial growth on a smooth surface of a p-type layer based on biaxial compressive strain, or via any other suitable method.

The layer of p-type nano-dots can be made of GaN or InGaN with In-composition less than 10% such as 3-7%, or AlGaN with Al-composition less than 5%. The p-type nano-dots may have a sheet density of $10^{10}$ to $10^{12}$ cm$^{-2}$ such as $10^{11}$ to $10^{12}$ cm$^{-2}$, a lateral dimension of 2-20 nm such as 5-15 nm, and a vertical dimension of 1-5 nm such as 1-2.5 nm. The layer of p-type nano-dots can be a continuous layer including thin layer portion connecting the p-type nano-dots, and the thickness of the thin layer portion can be in the range of 0.3-1.0 nm when the layer of p-type nano-dots is formed on a rough surface of a p-type layer, and the thickness of the thin layer portion can be in the range of 0.6-1.0 nm when the layer of p-type nano-dots is formed on a smooth surface of a p-type layer via large biaxial strain (the thin layer portion is also referred to as wetting layer portion in this case.).

Illustrated in FIG. 1A is the cross sectional schematic view of a partial p-type layer structure according to an embodiment of the present invention, which includes a smooth p-AlGaN layer 41 and a rough p-AlGaN layer 42, with p-type conductivity achieved via Mg-doping. The Al-compositions of layers 41 and 42 can be higher than 40%, in order to be UV transparent for the wavelengths below 320 nm. And the Al-composition in layer 41 can be higher than that of layer 42, for example, by 5-10%. In this specification, a smooth or rough layer means that the surface of the layer is of nanometer-scale smoothness or roughness. Specifically, a smooth or rough layer can be identified by its surface root mean square (RMS) of roughness. When evaluated by a surface scan metrology, such as atomic force microscope (AFM), if the surface RMS of roughness is less than 3 nm, the layer is a smooth layer; otherwise, it is a rough layer.

Figure 1B:
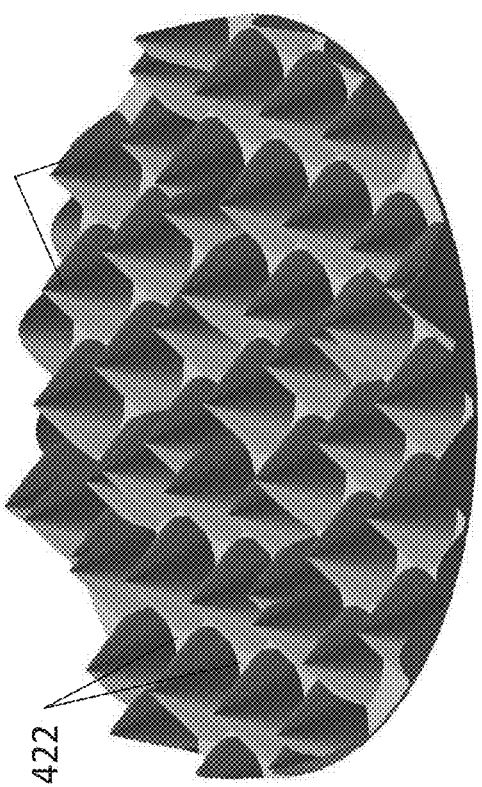
FIG. 1B illustrates a bird's eye view of the partial p-type layer structure shown in FIG. 1A.
Figure 3:
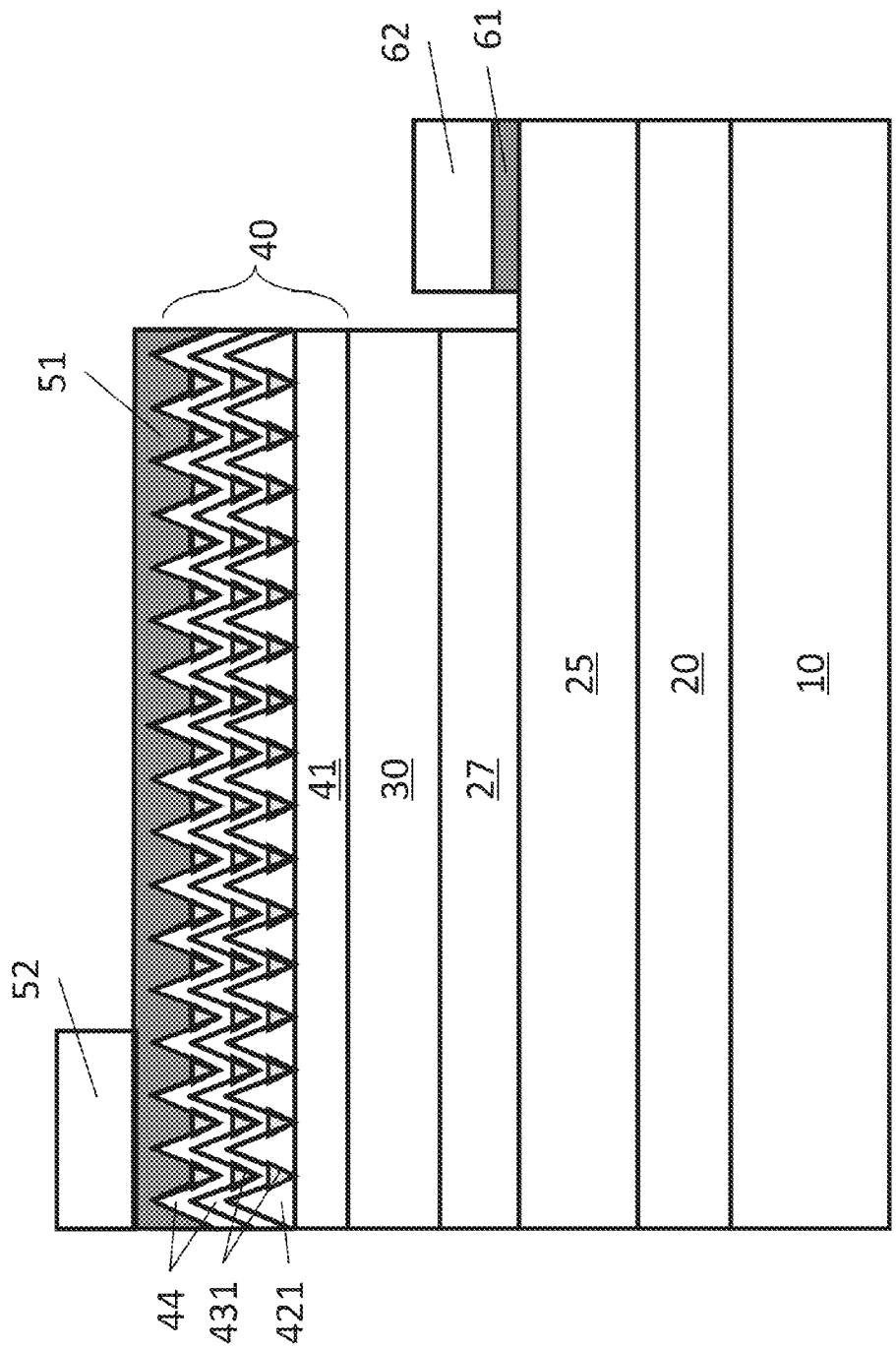
FIG. 3 illustrates a LED structure employing a transparent conductive p-type layer structure according to an embodiment of the present invention.

Layer 41 can be formed directly on an active-region, with a thickness in the range of 5-30 nm. For example, layer 41 is formed on the light-emitting active-region 30 of a light emitting device such as a UV light emitting device, serving as an electron blocking layer, as shown in FIG. 3. According to an embodiment of the present inventions, layer 42 formed on layer 41 possesses substantial surface roughness. Layer 42 has a base 420 and many surface protrusions 421. Base 420 can have a predetermined thickness (e.g. 2-10 nm, or 5-10 nm) or have a vanishing thickness (i.e. base 420 vanishes), and surface protrusions 421 sitting on base 420 are separated or laterally surrounded by surface depressions 422 (or sitting on layer 41 when base 420 vanishes). For clarity, FIG. 1B illustrates one possible bird's eye view of layer 42 shown in FIG. 1A. The lateral dimension, D, measured for the largest lateral dimension of protrusions 421, is in the range of 10 to 100 nm, for example 20 to 50 nm. This translates into a sheet density of surface protrusions 421 and depressions 422 approximately $10^{10}$ to $10^{12}$ cm$^{-2}$. The protrusion height, or depression depth, H, is in the range of 5 to 30 nm, for example 10 to 20 nm. Protrusions 421 and depressions 422 are formed via low-temperature epitaxial growth. That is to say, the epitaxial formation temperature of layer 42 is much lower than that of layer 41. According to one embodiment of the present invention, metalorganic chemical vapor deposition (MOCVD) is used to epitaxially form layers 41 and 42, where the formation temperature of layer 41 is typically within 1000-1050° C., and the formation temperature of layer 42 is typically 50-200° C. lower, i.e., within 800-1000° C. The lower the formation temperature, the higher the surface protrusions/depressions density. According to the present invention, Mg-doped p-type AlGaN requires substantial growth temperature to maintain smooth surface two-dimensional growth mode. At lower temperatures, the increased Mg incorporation rate and reduced Al-adatom surface mobility change the growth mode into three-dimensional island growth, resulting in surface protrusions and depressions. To further facilitate surface protrusions/depressions formation, the formation ambient can be switched from ammonia-hydrogen ambient to ammonia-nitrogen ambient.

Figure 2:
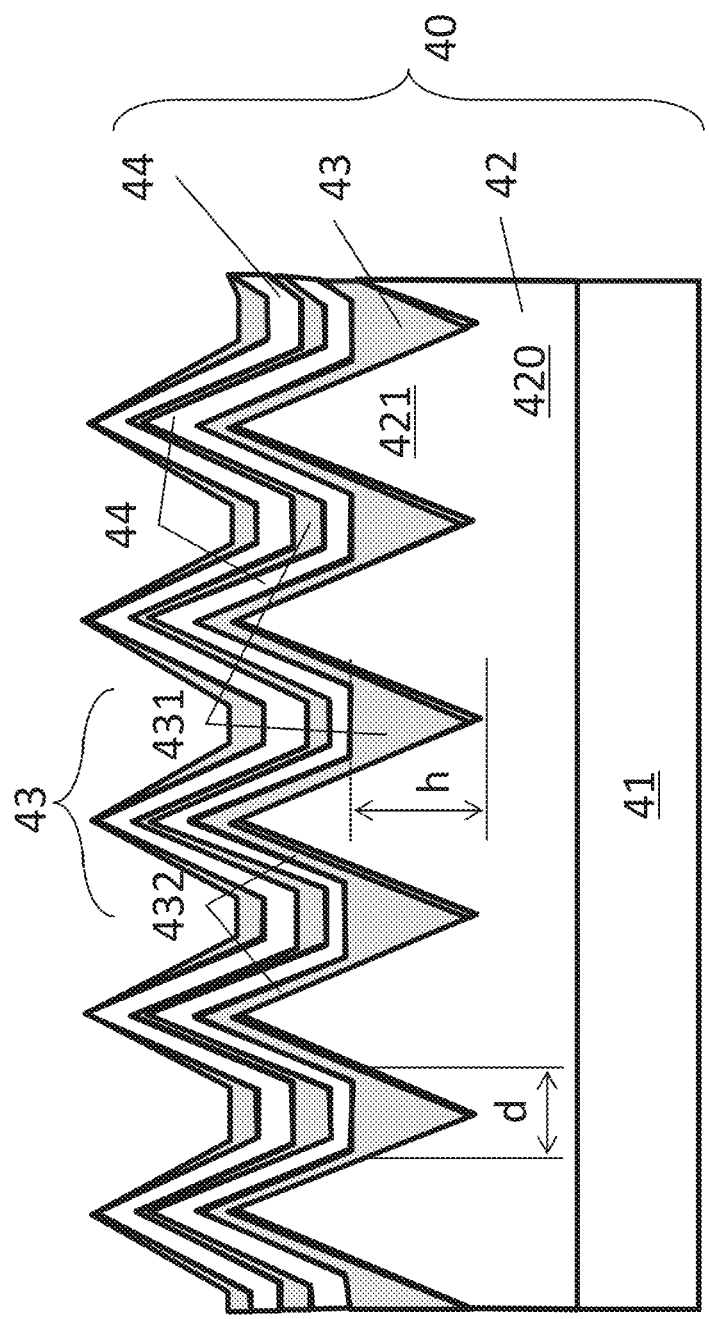
FIG. 2 illustrates the cross sectional schematic view of a conductive UV transparent p-type layer structure based on the partial p-type layer structure shown in FIG. 1.

The high sheet density of protrusions 421 and depression 422 is desired to formation of vertically conductive and UV transparent p-type AlGaN layer structures. FIG. 2 illustrates the cross-sectional schematic view of a vertically conductive UV transparent p-type AlGaN layer structure 40 according to an embodiment of the present invention. Directly formed on the rough surface of layer 42 is a nominal layer 43. Layer 43 can be a Mg-doped GaN layer, or InGaN layer with In-composition of 0-10% such as 3-6%, or AlGaN layer with significantly smaller Al-composition as compared to that of layer 42, such as 0-10%. In one embodiment, nominal layer 43 is made of Mg-doped GaN. Nominal layer 43 contains portions 432 formed on facets or sidewalls of protrusions 421 and portions 431 formed in the bottom parts of depressions 422. The facets or sidewalls of protrusions 421, because of the higher surface formation energy, permit much less formation of layer 43. As a result, layer 43 is predominantly formed within the bottom parts of depressions 422 and constitutes a layer of p-type nano-dots. That is to say, portions 432 can have much less or vanishing thickness as compared to portions 431. Therefore, layer 43 (i.e., the layer of p-type nano-dots) can be a continuous layer where the whole rough surface of layer 42 is covered by layer 43, or a discontinuous layer where a portion of protrusions 421 is exposed by layer 43. In case of a discontinuous layer, no layer 43 grows on top or upper portions of sidewalls of at least some protrusions 421, for example, 20-90% or 40-70% of the protrusions 421. Formed on nominal layer 43 is layer 44, which is a Mg-doped AlGaN layer with Al-composition equal or close to that of layer 42. The formation conditions of layer 43 and 44 are different from those for layer 42 but identical or close to those for layer 41. Because of the high-Al-composition, layer 44 is conformably formed over layer 43, with a rather uniform thickness of 2-10 nm. Layers 42, 43 and 44 are so formed that portions 431 are of a lateral dimension, d, in the range of 2-20 nm such as 5-15 nm, and a vertical dimension, h, in the range of 1-5 nm such as 1-3 nm. That is to say, portions 431 are three-dimensionally confined nano-dots. Compared to the one dimensionally confined GaN well layer in the prior art p-type AlGaN/GaN superlattice, portions 431 being three-dimensionally confined possess three dimensional polarization and valence band discontinuities hence accumulate much higher concentration of free holes. In the prior art p-type AlGaN/GaN superlattice, hole concentration in the GaN well layer can be as high as $10^{18}$ cm$^{-3}$. According to this invention, because of the stronger confinement and more polarization discontinuities, the hole concentration within portions 431 can be in the range of $10^{19}$-$10^{20}$ cm$^{-3}$.

Further refer to FIG. 2, layer 43 and layer 44 can be repeatedly stacked on top of each other for more than one time. For example, layers 43/44 can be stacked for 3 times to 10 times. Repeatedly alternatively stacking layer 43 and layer 44 leads to formation of arrays of vertically aligned nano-dot portions 431. When a vertical forward bias voltage is applied to p-AlGaN layer structure 40, the otherwise uniformly distributed electric field will be redistributed, intensified and focused on the highly conductive nano-dot portions 431, enabling hole tunneling current within the vertically aligned highly conductive nano-dot portions 431. That is to say, p-AlGaN layer structure 40 is a vertically conductive UV transparent p-type AlGaN layer structure.

FIG. 3 illustrates a UV light emitter device structure employed with vertically conductive UV transparent p-AlGaN layer structure 40. Substrate 10 can be selected from sapphire, AlN, SiC, Si, and the like. Formed over substrate 10 is a template 20, which can be made of a thick AlN layer. An AlN/AlGaN superlattice can also be included in template 20 for strain management. Following template 20 is a thick n-AlGaN layer 25 for electron supplier and ohmic contact formation. Layer 27 formed over layer 25 is a lightly doped n-AlGaN layer for current spreading, preparing uniform current injection into the following AlGaN/AlGaN MQW active-region 30. A vertically conductive UV transparent p-type AlGaN layer structure 40 is formed on active-region 30. In this embodiment shown in FIG. 3, p-AlGaN layer structure 40 includes a smooth electron blocking p-AlGaN layer 41, a rough p-AlGaN layer 42, with vanishing base 420, a stack of three pairs of layers 43/44, again with vanishing portions 432. Here vanishing portions 432 means that very little portions 432 are formed during the epitaxial growth of layer 43, layer 43 is formed mainly as nano-dots in the bottom parts of depressions 422, and these nano-dots may or may not be connected to each other by portions 432 or thin layer portion of layer 43, or some of the nano-dots are isolated nano-dots and some of the nano-dots are connected to each other via portions 432. A UV light reflective p-type ohmic contact 51 is formed over p-AlGaN layer structure 40. The ohmic contact property is assured by forming the p-type ohmic contact 51 in contact with the highly conductive three-dimensionally confined portions 431. In an embodiment, the nominal layer thickness of layers 41, 42, 43, and 44 can be 30, 50, 2, and 8 nm, respectively. A UV light reflective n-type ohmic contact 61 is formed over layer 25, and p− and n− contact pads 52 and 62 are respectively formed over reflective ohmic contacts 51 and 61. When forward bias is applied to the device shown in FIG. 3, hole current tunnels through the vertically aligned nano-dot portions 431, providing sufficient hole injection into active-region 30. In another embodiment, a thin p-type GaN or InGaN layer of thickness not larger than 5 nm can be inserted in-between p-AlGaN layer structure 40 and p-type ohmic contact 51.

Figure 4:
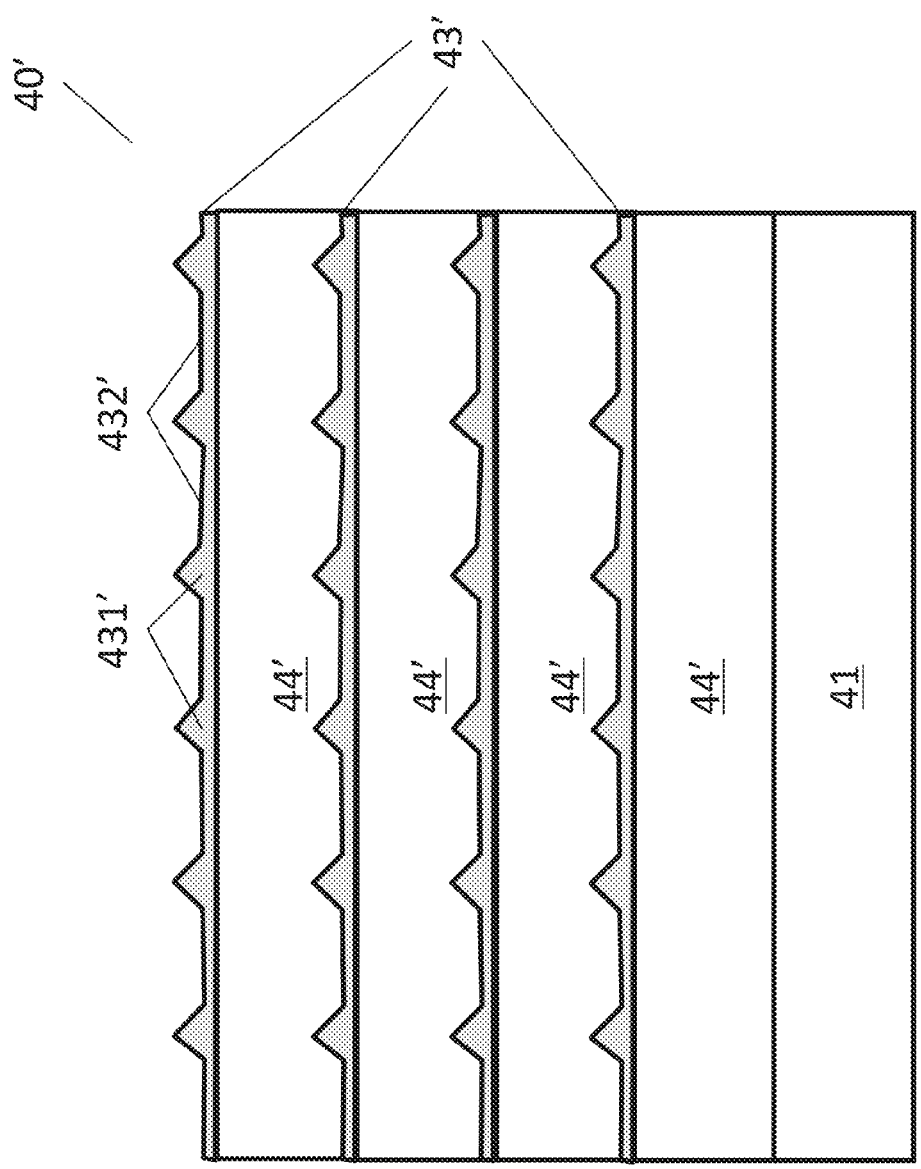
FIG. 4 illustrates the cross sectional schematic view of a conductive UV transparent p-type layer structure according to another embodiment of the present invention.

The arrays of vertically aligned nano-dot portions 431 shown in FIG. 2 and FIG. 3 are formed via physical location confinement by depressions 422 formed on the rough surface of layer 42. According to another aspect of the present invention, arrays of vertically aligned nano-dot portions can also be formed via biaxial compressive strain confinement. Shown in FIG. 4 is another vertically conductive UV transparent p-AlGaN layer structure 40', with compressive strain confined vertically aligned nano-dot portions 431' as the hole conducting channels. Layer 41, together with layers 44', exerts large biaxial compressive strain to nominal layer 43'. The compressive strain experienced by nominal layer 43' should be larger than 0.7%, preferably larger than 1.0%. That is to say, if nominal layer 43' is made of Mg-doped GaN, layer 41 and layer 44' can be Mg-doped AlGaN with Al-composition larger than 30%, preferably larger than 40%, in view of the lattice constant difference between GaN and AlN. Al-composition of layer 41 can be higher than that of layer 44' by 0-10%, such as 5-10%. According to this aspect of the present invention, layer 43' is preferably made of Mg-doped InGaN with In-composition in the range of 0-10% such as 5-10%. The incorporation of Indium into layer 43' enlarges the compressive strain experienced by layer 43' hence facilitates the formation of nano-dot portions 431'. The nominal thickness for nominal layer 43' is within the range of 1-5 nm. The so-designed compressive strain will induce epitaxial growth of layer 43' on layer 41 or 44' to follow the Stranski-Krastanov (SK) growth mode.

According to the SK growth mode, under a critical thickness (for example under 1 nm or under 0.6 nm) layer 43' will firstly undergo two-dimensional layer-by-layer growth, and this wetting process leads to the formation of thin layer or wetting layer portions 432'. Above the critically thickness, growth of layer 43' transforms from two-dimensional layer-by-layer growth to three dimensional island growth, resulting in the formation of nano-dot portions 431'. Overgrowth of nominal layer 43' can result in island enlargement and coalescence, losing the benefit of nano-dots for harvest of high concentration of holes arising from the three-dimensional valence band and polarization discontinuities. Depending on the compressive strain under interest of the present invention, the wetting layer portions 432' are of thickness in the range of 0.6-1.0 nm. The density and size of the nano-dot portions 431' are controlled by formation temperature and nominal layer thickness of layer 43'. According to an embodiment of the present invention, the sheet density of nano-dot portions 431' is in the range of approximately $10^{10}$ to $10^{12}$ cm$^{-2}$. Portions 431' preferably possess a lateral dimension in the range of 2-20 nm such as 5-15 nm, and a vertical dimension in the range of 1-5 nm such as 1-3 nm.

Further refer to FIG. 4, layer 43' and layer 44' can be repeatedly stacked on top of each other for more than one time. For example, layers 43'/44' can be stacked for 3 times to 10 times. Repeatedly alternatively stacking layer 43' and layer 44' leads to the formation of arrays of vertically aligned nano-dot portions 431'. By controlling formation conditions, nano-dot portions 431' in different layers 43 can be substantially vertically aligned. It is also possible to form layers 43, where nano-dot portions 431' in different layers 43 are not vertically aligned. When a vertical forward bias voltage is applied to p-AlGaN layer structure 40', the otherwise uniformly distributed electric field will be redistributed, intensified and focused on the highly conductive nano-dot portions 431', enabling hole tunneling current within the vertically aligned highly conductive nano-dot portions 431'. That is to say, p-AlGaN layer structure 40' is a vertically conductive UV transparent p-type AlGaN layer structure.

According to one embodiment of this aspect of the present invention, MOCVD is used to epitaxially form vertically conductive UV transparent p-AlGaN layer structure 40' shown in FIG. 4. Layers 41 and 44' are formed at a temperature of 1000-1050° C., and layers 43' are formed at a temperature of 800-1000° C., in order to achieve the desire sheet density of nano-dot portions 431', the lower the formation temperature, the higher the sheet density of nano-dot portions 431'.

Figure 5:
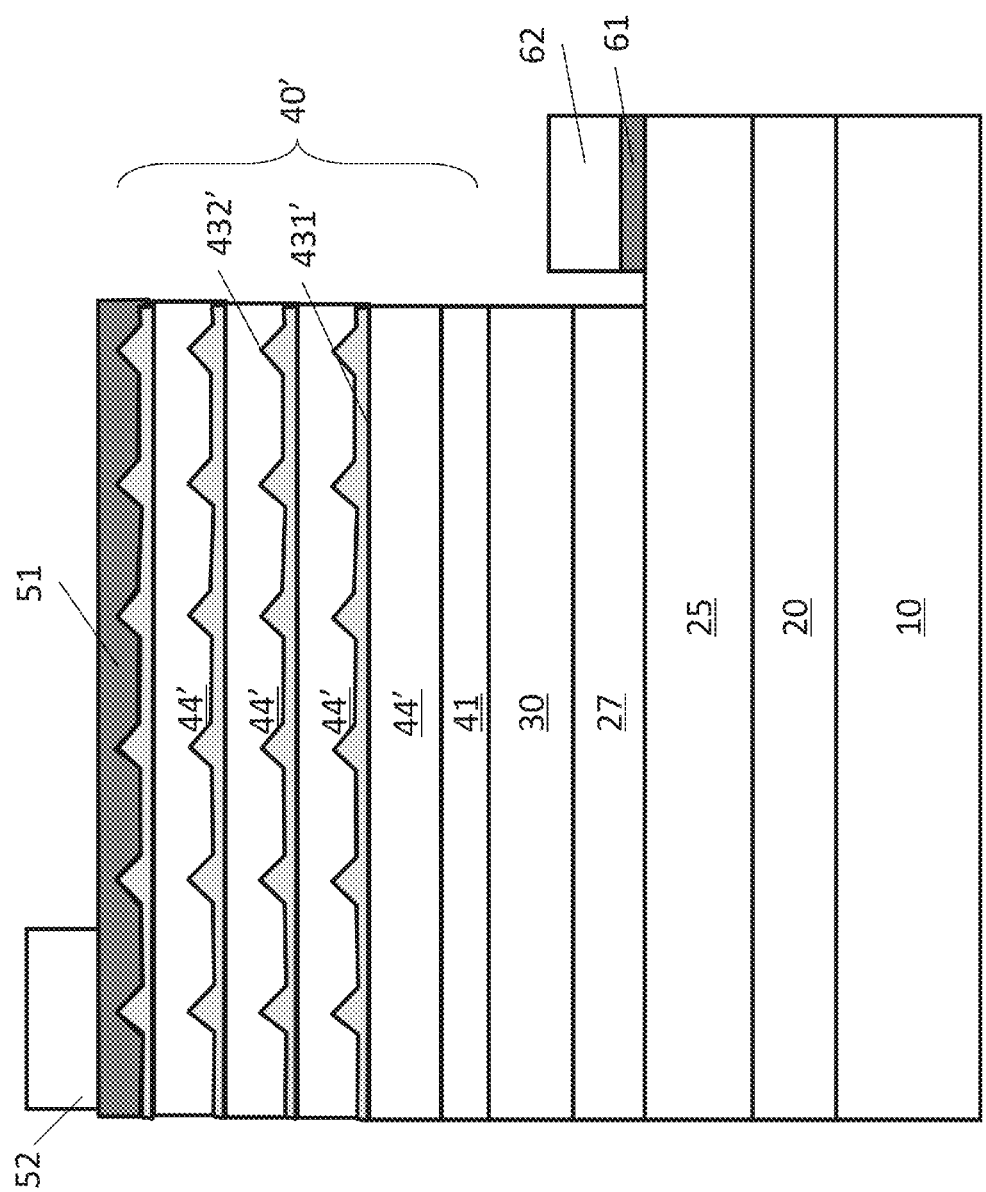
FIG. 5 illustrates a LED structure employing the transparent conductive p-type layer structure according to another embodiment of the present invention.

FIG. 5 illustrates a UV light emitter device structure employed with vertically conductive UV transparent p-AlGaN layer structure 40'. Substrate 10 can be selected from sapphire, AlN, SiC, Si, and the like. Formed over substrate 10 is a template 20, mainly made of a thick AlN layer. An AlN/AlGaN superlattice can also be included in template 20 for strain management. Following template 20 is a thick n-AlGaN layer 25 for electron supplier and ohmic contact formation. Layer 27 formed over layer 25 is a slightly doped n-AlGaN layer for current spreading, preparing uniform current injection into the following AlGaN/AlGaN MQW active-region 30. A vertically conductive UV transparent p-AlGaN layer structure 40' is formed over active-region 30. In this embodiment shown in FIG. 5, p-AlGaN layer structure 40' includes a smooth electron blocking AlGaN layer 41, a stack of four pairs of layers 43'/44'. A UV light reflective p-type ohmic contact 51 is formed over p-AlGaN structure 40'. The ohmic contact property is assured by forming the p-type ohmic contact 51 in contact with the highly conductive three-dimensionally confined portions 431'. In some embodiments, the nominal layer thickness of layers 41, 43', and 44' can be 50, 2, and 8 nm, respectively. A UV light reflective n-type ohmic contact 61 is formed over layer 25, and p− and n− contact pads 52 and 62 are respectively formed over reflective ohmic contacts 51 and 61. When forward bias is applied to the device shown in FIG. 5, hole current tunnels through the vertically aligned nano-dot portions 431', providing sufficient hole injection into active-region 30. In another embodiment, a thin p-type GaN or InGaN layer of thickness not larger than 5 nm can be inserted in-between p-AlGaN layer structure 40' and p-type ohmic contact 51.

The light emitting devices made according to FIG. 3 and FIG. 5 are substantially UV transparent, allowing improved UV light extraction efficiency.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A method of forming a vertically conductive UV transparent p-type layer structure, comprising steps:
   forming a smooth p-type AlGaN layer on a light emitting active-region of a light emitting device via metalorganic chemical vapor deposition at a temperature between 1000-1050° C., wherein the smooth p-type AlGaN layer serves as an electron blocking layer;
   forming a rough p-type AlGaN layer on the smooth p-type AlGaN layer via metalorganic chemical vapor deposition at a temperature 50-200° C. lower than that of the smooth p-type AlGaN layer so as to form surface protrusions of height 5 to 30 nm, lateral size 10 to 100 nm, and sheet density $10^{10}$ to $10^{12}$ cm$^{-2}$ on the rough p-type AlGaN layer, wherein the smooth p-type AlGaN layer and the rough p-type AlGaN layer are UV transparent for wavelength below 320 nm;
   forming a p-type InGaN layer with an In-composition of 0-10% or a p-type AlGaN layer with an Al-composition of 0-10% on the rough p-type AlGaN layer via metalorganic chemical vapor deposition at a temperature between 800-1000° C., such that a layer of nano-dots is formed with the nano-dots being formed within depressions between the protrusions of the rough p-type AlGaN layer, wherein the nano-dots possess a sheet density of $10^{10}$ to $10^{12}$ cm$^{-2}$, a lateral dimension of 2-20 nm, a vertical dimension of 1-5 nm; and
   conformally forming a confining p-type AlGaN layer on the p-type InGaN layer or the p-type AlGaN layer via metalorganic chemical vapor deposition to cover the nano-dots.

2. The method of forming the vertically conductive UV transparent p-type layer structure according to claim 1, wherein an Al-composition of the confining p-type AlGaN layer is substantially the same as that of the rough p-type AlGaN layer.

3. The method of forming the vertically conductive UV transparent p-type layer structure according to claim 1, wherein a formation ambient in the metalorganic chemical vapor deposition for forming the rough p-type AlGaN layer is ammonia-nitrogen ambient.

4. The method of forming the vertically conductive UV transparent p-type layer structure according to claim 1, wherein an Al-composition of the smooth p-type AlGaN layer is 5-10% higher than an Al-composition of the rough p-type AlGaN layer.

5. The method of forming the vertically conductive UV transparent p-type layer structure according to claim 1, wherein multiple pairs of the confining p-type AlGaN layer and the layer of nano-dots are formed on the rough p-type AlGaN layer.

6. The method of forming the vertically conductive UV transparent p-type layer structure according to claim 1, further comprising:
    forming a UV light reflective p-type ohmic contact on the confining p-type AlGaN layer.

7. The method of forming the vertically conductive UV transparent p-type layer structure according to claim 1, wherein a thickness of the smooth p-type AlGaN layer is in a range of 5-30 nm.

8. The method of forming the vertically conductive UV transparent p-type layer structure according to claim 1, wherein a thickness of the confining p-type AlGaN layer is in a range of 2-10 nm.

9. A method of forming a vertically conductive UV transparent p-type structure, comprising steps:
    forming a smooth p-type AlGaN layer on a light emitting active-region of a light emitting device via metalorganic chemical vapor deposition at a temperature of 1000-1050° C.;
    forming a p-type AlGaN layer on the smooth p-type AlGaN layer via metalorganic chemical vapor deposition at a temperature of 1000-1050° C., wherein the Al-composition of the smooth p-type AlGaN layer is 5-10% higher than an Al-composition of the p-type AlGaN layer;
    forming a p-type InGaN layer with an In-composition of 0-10% and a nominal thickness of 1-5 nm on the p-type AlGaN layer in Stranski-Krastanov growth mode via metalorganic chemical vapor deposition at a temperature of 800-1000° C., so that the p-type InGaN layer is formed with a wetting layer portion and nano-dots, wherein the nano-dots possess a sheet density of $10^{10}$ to $10^{12}$ cm$^{-2}$, a lateral dimension of 2-20 nm, a vertical dimension of 1-5 nm.

10. The method of forming the vertically conductive UV transparent p-type layer structure according to claim 9, further comprising:
    forming a UV light reflective p-type ohmic contact on the p-type InGaN layer.

11. The method of forming the vertically conductive UV transparent p-type layer structure according to claim 9, wherein a thickness of the p-type AlGaN layer is in a range of 2-10 nm.

12. The method of forming the vertically conductive UV transparent p-type layer structure according to claim 9, wherein a thickness of the smooth p-type AlGaN layer is in a range of 5-30 nm.

* * * * *